US012685035B2

(12) United States Patent
Yang et al.

(10) Patent No.: US 12,685,035 B2
(45) Date of Patent: Jul. 14, 2026

(54) SYNAPTIC DEVICE, RESERVOIR COMPUTING DEVICE INCLUDING THE SYNAPTIC DEVICE, AND RESERVOIR COMPUTING METHOD USING THE COMPUTING DEVICE

(71) Applicants:KOREA ADVANCED INSTITUTE OF SCIENCE AND TECHNOLOGY, Daejeon (KR); RESEARCH & BUSINESS FOUNDATION SUNGKYUNKWAN UNIVERSITY, Gyeonggi-do (KR)

(72) Inventors: Heejun Yang, Daejeon (KR); Linfeng Sun, Beijing (CN)

(73) Assignees: Korea Advanced Institute of Science and Technology, Daejeon (KR); Research & Business Foundation Sungkyunkwan University, Gyeonggi-do (KR)

( * ) Notice: Subject to any disclaimer, the term of this patent is extended or adjusted under 35 U.S.C. 154(b) by 1106 days.

(21) Appl. No.: 17/737,369

(22) Filed: May 5, 2022

(65) Prior Publication Data

US 2023/0030949 A1     Feb. 2, 2023

(30) Foreign Application Priority Data

Jul. 16, 2021    (KR) ........................ 10-2021-0093382
Mar. 14, 2022    (KR) ........................ 10-2022-0031368

(51) Int. Cl.
  *H10N 70/20*        (2023.01)
  *G06N 3/044*        (2023.01)
  (Continued)

(52) U.S. Cl.
  CPC ............. *H10N 70/24* (2023.02); *G06N 3/044* (2023.01); *G06N 20/00* (2019.01);
  (Continued)

(58) Field of Classification Search
  CPC . G11C 13/0069; G11C 11/54; G11C 13/0007; G11C 13/004
  See application file for complete search history.

(56) References Cited

U.S. PATENT DOCUMENTS 11,462,647 B2    10/2022  Yu et al.
11,783,160 B2 *  10/2023  Knag ..................... G06N 3/063
                                                       706/30

(Continued)

FOREIGN PATENT DOCUMENTS

CN        106847817 A      6/2017
CN        107346449 A     11/2017
                (Continued)

OTHER PUBLICATIONS

Written opinion JP office (Year: 2022).*

(Continued)

*Primary Examiner* — Mushfique Siddique
(74) *Attorney, Agent, or Firm* — Harness, Dickey & Pierce, P.L.C.

(57)          ABSTRACT

Disclosed is a synaptic device, a reservoir computing device using the synaptic device, and a reservoir computing method using the reservoir computing device. The synaptic device includes a substrate and a plurality of units cells on the substrate, wherein the unit cells each include a channel layer and a first electrode and second electrode intersecting the channel layer, wherein the first electrode and the second electrode are spaced apart from each other, and define a gap region exposing a portion of the channel layer, and the channel layer includes a 2-dimensional semiconductor material or a 2-dimensional ferroelectric material.

12 Claims, 16 Drawing Sheets

(51) Int. Cl.
    *G06N 20/00*     (2019.01)
    *G11C 13/00*     (2006.01)
    *H10B 63/00*     (2023.01)
    *H10N 70/00*     (2023.01)

(52) U.S. Cl.
    CPC ...... *G11C 13/0007* (2013.01); *G11C 13/0069* (2013.01); *H10B 63/80* (2023.02); *H10N 70/257* (2023.02); *H10N 70/8822* (2023.02); *H10N 70/8825* (2023.02); *H10N 70/8828* (2023.02); *H10N 70/884* (2023.02); *H10N 70/8845* (2023.02)

(56)       References Cited

U.S. PATENT DOCUMENTS

| | | | |
|---|---|---|---|
| 2014/0355331 A1* | 12/2014 | Yi | G11C 11/56 |
| | | | 365/148 |
| 2020/0342548 A1 | 10/2020 | Mazed et al. | |
| 2020/0395540 A1 | 12/2020 | Lee et al. | |
| 2021/0098611 A1 | 4/2021 | Hersam et al. | |
| 2022/0044100 A1* | 2/2022 | Yoo | G11C 11/54 |
| 2022/0068379 A1* | 3/2022 | Kim | G11C 13/004 |
| 2023/0055056 A1* | 2/2023 | Suzuki | H10N 35/85 |

FOREIGN PATENT DOCUMENTS

| | | |
|---|---|---|
| CN | 110739393 A | 1/2020 |
| CN | 112784976 A | 5/2021 |
| JP | H06-20074 A | 1/1994 |
| KR | 10-2019-0021650 A | 3/2019 |
| KR | 10-2020-0068051 A | 6/2020 |
| KR | 10-2020-0144035 A | 12/2020 |
| KR | 102196523 B1 | 12/2020 |
| KR | 10-2021-0009692 A | 1/2021 |
| KR | 102198721 B1 | 1/2021 |

OTHER PUBLICATIONS

JP office action written opinion (Year: 2022).*

L. Appeltant et al., Information processing using a single dynamical node as complex system, Nature Communications, 2011.

Kristof Vandoorne et al., Experimental demonstration of reservoir computing on a silicon photonics chip, Nature Communications, 2014.

Chao Du et al., Reservoir computing using dynamic memristors for temporal information processing, Nature Communications 8, 2204 (2017).

John Moon et al., Temporal data classification and forecasting using a memristor-based reservoir computing system, Nature Electronics 2, 480 (2019).

Yanan Zhong et al., Dynamic memristor-based reservoir computing for high-efficiency temporal signal processing, Nature Communications, 2021.

Linfeng Sun et al., In-sensor reservoir computing for language learning via two-dimensional memristors, Science Advances, 2021.

* cited by examiner

SYNAPTIC DEVICE, RESERVOIR COMPUTING DEVICE INCLUDING THE SYNAPTIC DEVICE, AND RESERVOIR COMPUTING METHOD USING THE COMPUTING DEVICE

CROSS-REFERENCE TO RELATED APPLICATIONS

This U.S. non-provisional patent application claims priority under 35 U.S.C. § 119 of Korean Patent Application Nos. 10-2021-0093382, filed on Jul. 16, 2021, and 10-2022-0031368, filed on Mar. 14, 2022, the entire contents of which are hereby incorporated by reference.

BACKGROUND

The present disclosure herein relates to a synaptic device, a reservoir computing device including the synaptic device, and a reservoir computing method using the reservoir computing device, and more particularly, to a synaptic device including a two-dimensional material that exhibits synaptic plasticity and has opposite resistance variable plasticity for an electric signal and an optical signal, a reservoir computing device including the synaptic device, and a reservoir computing method using the reservoir computing device.

A brain neural network includes neurons that are nerve cells, synapses connecting the neurons, etc. Synapses calculate and learn information input from neurons. In particular, synapses only use about 1 pJ (10-12 J) of energy to process information, and thus may more efficiently process information than other artificial intelligence hardware. Information processing performed in synapses is caused by the phenomenon of synaptic plasticity, according to which a synaptic connection becomes stronger at a site where the frequency of spikes exhibited in a nervous system is high, and a connection becomes weaker at a site where the frequency of spikes is not high.

Accordingly, in a wide range of fields requiring low power consumption, such as Internet of things (IoT) and edge computing, researches are actively carried out with respect to a neuromorphic technology for emulating information processing of a human brain using synaptic plasticity.

SUMMARY

The present disclosure provides a synaptic device including a two-dimensional material that exhibits synaptic plasticity and has opposite resistance variable plasticity for an electric signal and an optical signal.

The present disclosure also provides a reservoir computing device and a reservoir computing method using the same, which make it possible to learn and analyze a signal that changes over time with low energy and low cost.

The purposes of the present disclosure are not limited to the above-mentioned purposes, and other purposes not mentioned would be clearly understood by those skilled in the art from the disclosure below.

An embodiment of the inventive concept provides a synaptic device including: a substrate; and a plurality of units cells on the substrate, wherein the unit cells each include a channel layer and a first electrode and second electrode intersecting the channel layer, wherein the first electrode and the second electrode are spaced apart from each other, and define a gap region exposing a portion of the channel layer, and the channel layer includes a 2-dimensional semiconductor material or a 2-dimensional ferroelectric material.

In an embodiment, the channel layer may have a thickness of about 1 nm to about 50 nm.

In an embodiment, the 2-dimensional semiconductor material may be one of $MoS_2$, $MoSe_2$, $MoTe_2$, $WS_2$, $WSe_2$, SnS, $SnS_2$, graphene oxide, or black phosphorous, and the 2-dimensional ferroelectric material may be one of SnS, SnSe, SnTe, InSe, or $In_2Se_3$.

In an embodiment, the gap region may have a width of about 0.5 μm to about 3 μm.

In an embodiment, the channel layer may have an integrated shape traversing the unit cells.

In an embodiment, the channel layer may be provided in plurality, and the channel layers may be spaced apart from each other, and a portion of the substrate may be exposed therebetween.

In an embodiment, the channel layer may have a characteristic in which a current reduces according to repeated electric pulse signals and a characteristics in which the current increases according to repeated optical pulse signals.

In an embodiment, the channel layer may have a characteristic in which the current changes nonlinearly in response to pulses having the same magnitude and repeated at the same interval.

In an embodiment of the inventive concept, a reservoir computing device includes: an input signal generation unit configured to generate an input signal corresponding to a learning target pattern; a measurement unit configured to measure a result according to the input signal; and a learning unit configured to learn the learning target pattern through values measured by the measurement unit, wherein the measurement unit includes: a substrate; and a plurality of units cells on the substrate, wherein the unit cells each include a channel layer and a first electrode and second electrode intersecting the channel layer, wherein the first electrode and the second electrode are spaced apart from each other, and define a gap region exposing a portion of the channel layer, and the channel layer includes a 2-dimensional semiconductor material or a 2-dimensional ferroelectric material.

In an embodiment, the learning target pattern may be a consonant, vowel, syllable, word, sentence, nonverbal symbol, picture, or figure.

In an embodiment, the input signal may be a signal that changes over time.

In an embodiment, the input signal may include at least one of an electric pulse signal or an optical pulse signal.

In an embodiment, the result according to the input signal, measured by the measurement unit, may be an electric conductivity value of the channel layer, which changes according to the input signal.

In an embodiment, the learning target pattern may be expressed by a plurality of rows, and each of the plurality of rows may be expressed by a plurality of input signals.

In an embodiment, the learning unit may use single-layer perceptron, multi-layer perceptron, random forest, support vector machine, or logistic regression.

In an embodiment of the inventive concept, a reservoir computing method includes: preparing a learning target pattern; representing the learning target pattern by pulse signals; inputting each of the pulse signals to a memristor; and training with the learning target pattern through conductivity values of the memristor, wherein the memristor includes a channel layer and a first electrode and second electrode intersecting the channel layer, wherein the first electrode and the second electrode are spaced apart from each other, and define a gap region exposing a portion of the channel layer, and the channel layer includes a 2-dimensional semiconductor material or a 2-dimensional ferroelectric material.

In an embodiment, each of the pulse signals may be a binary pulse signal.

In an embodiment, the representing the learning target pattern by the pulse signals may include: representing the learning target pattern by a plurality of rows; and representing each of the plurality of rows by the pulse signals.

In an embodiment, the training with the learning target pattern through the conductivity values of the memristor may include: extracting the conductivity values from a conductivity graph of the memristor; and inputting the conductivity values to a machine learning model.

In an embodiment, the pulse signals may include at least one of an electric pulse signal or an optical pulse signal, wherein the electric pulse signal may be input through the first electrode or the second electrode, and the optical pulse signal may be input through the gap region.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
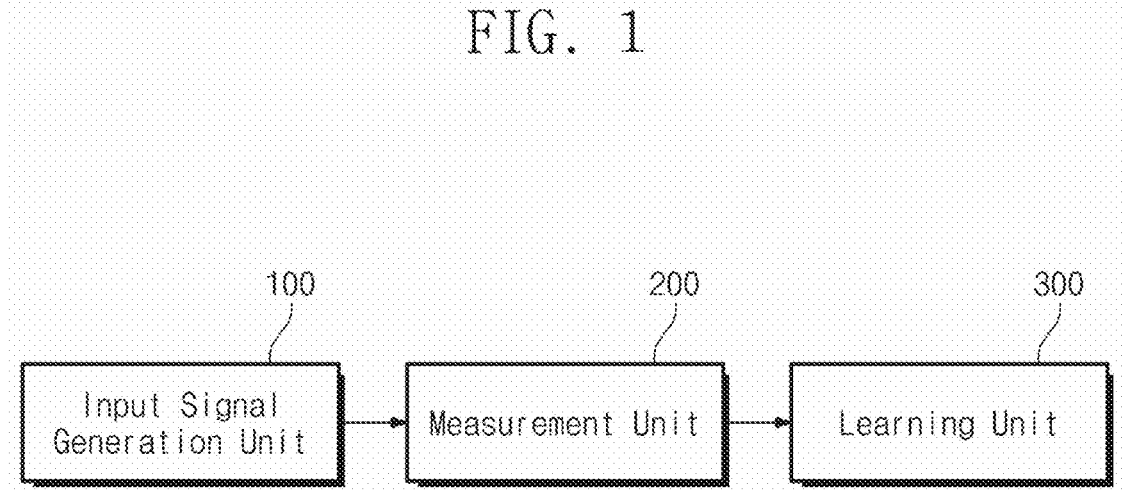
FIG. 1 is a conceptual diagram for describing a reservoir computing device according to an embodiment of the inventive concept.

Hereinafter, embodiments of the inventive concept will be described with reference to the accompanying drawings so that the configuration and effects of the inventive concept are sufficiently understood.

The inventive concept is not limited to the embodiments described below, but may be implemented in various forms and may allow various changes and modifications. Rather, the embodiments are provided so that this disclosure will be thorough and complete, and will fully convey the scope of the inventive concept to those skilled in the art. In the accompanying drawings, the scale ratios among elements may be exaggerated or reduced for convenience.

The terminology used herein is not for limiting the invention but for describing particular embodiments. Furthermore, the terms used herein may be interpreted as the meanings known in the art unless the terms are defined differently.

The terms of a singular form may include plural forms unless otherwise specified. It will be further understood that the terms "includes", "including", "comprises", and/or "comprising", when used in this description, specify the presence of stated elements, steps, operations, and/or components, but do not preclude the presence or addition of one or more other elements, steps, operations, and/or components.

The terms "first", "second", and the like are used herein to describe various regions, directions, shapes, etc., but these regions, directions, and shapes should not be limited by these terms. These terms are only used to distinguish one region, direction, or shape from another region, direction, or shape. Therefore, a part referred to as a first part in an embodiment may be referred to as a second part in another embodiment. The embodiments described herein also include complementary embodiments thereof. Like reference numerals refer to like elements throughout.

Hereinafter, a synaptic device, a reservoir computing device including the synaptic device, and a reservoir computing method using the reservoir computing device according to embodiments of the inventive concept will be described in detail with reference to the drawings.

FIG. 1 is a conceptual diagram for describing a reservoir computing device according to an embodiment of the inventive concept.

Referring to FIG. 1, a reservoir computing device according to an embodiment of the inventive concept may include an input signal generation unit 100, a measurement unit 200, and a learning unit 300.

A signal generated by the input signal generation unit 100 may be a pulse signal. A signal generated by the input signal generation unit 100 may be an electric signal or an optical signal.

The measurement unit 200 may include the synaptic device as described below with reference to FIGS. 2A and 2B. The synaptic device may include at least one memristor. Here, the memristor is a passive device capable of memorizing an amount of current that passed in the past. The memristor has such characteristics that a tendency of current that flowed in the past is memorized and resistance changes according to the tendency of current.

The learning unit 300 may be a machine learning model that is trained with learning target patterns through measured values (e.g., conductivity values) measured by the measurement unit 200. The machine learning model may use, for example, a supervised learning technique. The machine learning model may use, for example, techniques such as single-layer perceptron, multi-layer perceptron, random forest, support vector machine, logistic regression, or the like.

Figure 2A:
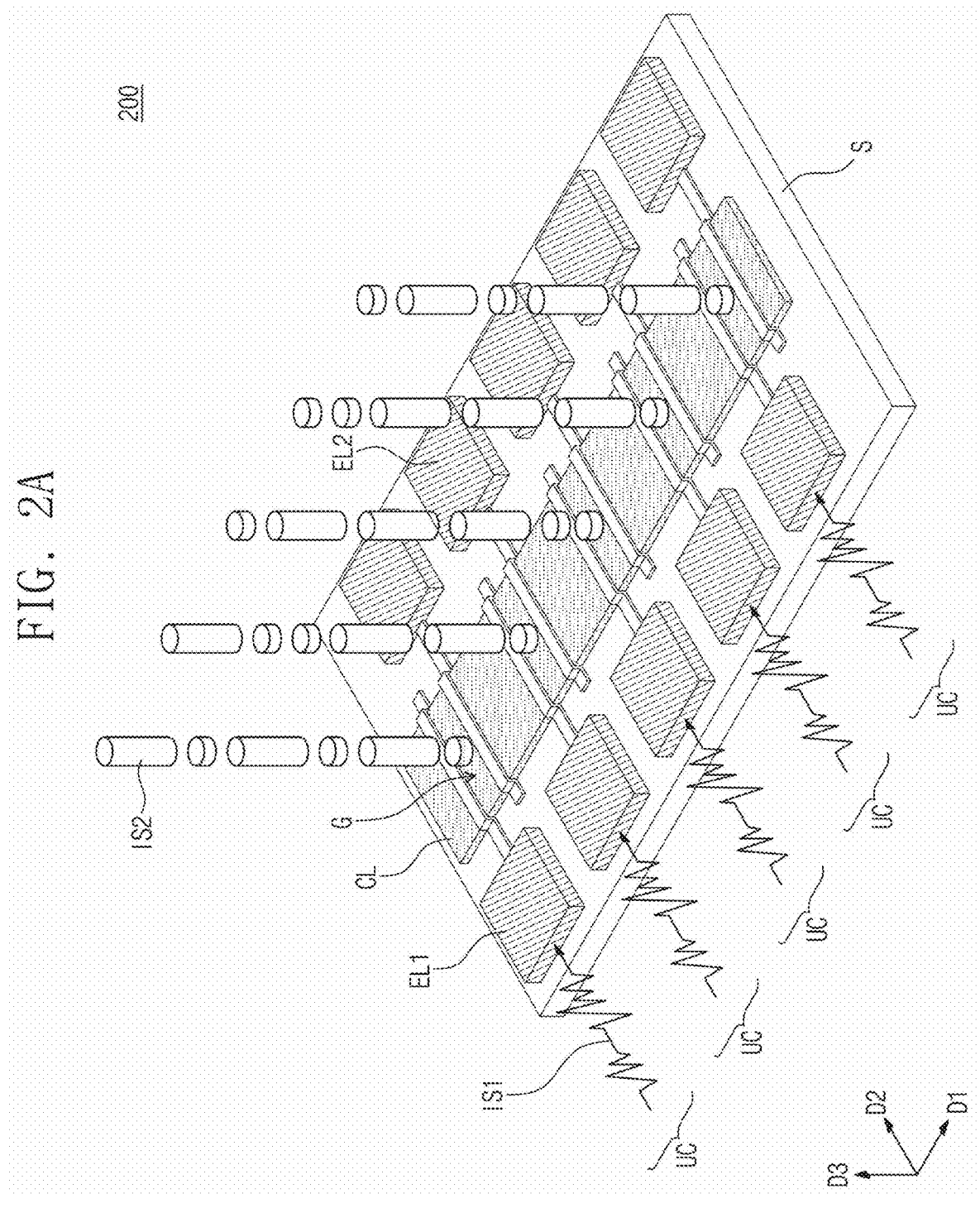
FIGS. 2A and 2B are perspective views for describing a synaptic device according to embodiments of the inventive concept.

FIG. 2A is a perspective view for describing a synaptic device according to embodiments of the inventive concept.

Referring to FIG. 2A, a synaptic device (i.e., the measurement unit 200) according to an embodiment of the inventive concept may include a substrate S and a plurality of unit cells UC on the substrate S. The substrate S may be, for example, a semiconductor substrate such as a silicon substrate or a silicon on insulator (SOI) substrate. The substrate S may have an upper surface that is parallel with a first direction D1 and a second direction D2 intersecting the first direction D1 and is perpendicular to a third direction D3. The first to third directions D1 to D3 may be, for example, directions orthogonal to each other.

Each of the unit cells UC may include a channel layer CL extending in the first direction CL and first and second electrodes EL1 and EL2 intersecting the channel layer CL and extending in the second direction D2. Each of the unit cells UC may be a single memristor.

The channel layer CL, for example, may have an integrated shape arranged across the plurality of unit cells UC and extending in the first direction D1. A thickness of the channel layer CL in the third direction D3 may be, for example, about 1 nm to about 50 nm. Hereinafter, a thickness may refer to a thickness in the third direction D3. The channel layer CL may include a 2-dimensional semiconductor material or a 2-dimensional ferroelectric material. The 2-dimensional semiconductor material may be, for example, $MoS_2$, $MoSe_2$, $MoTe_2$, $WS_2$, $WSe_2$, SnS, $SnS_2$, graphene oxide, black phosphorous, or the like. The 2-dimensional ferroelectric material may be, for example, SnS, SnSe, SnTe, InSe, $In_2Se_3$, or the like.

Each of the first and second electrodes EL1 and EL2 may include a first part spaced apart from the channel layer CL and a second part that is connected to the first part, covers the channel layer CL, and extends in the second direction D2. The first part of the first electrode EL1 may be spaced apart from the first part of the second electrode EL2 with the channel layer CL therebetween. The second part of the first electrode EL1 and the second part of the second electrode EL2 may be spaced apart from each other in the first direction D1. A gap region G, which exposes at least a portion of the channel layer CL, may be defined by the second part of the first electrode EL1 and the second part of the second electrode EL2. A width of the gap region G in the first direction D1 may be about 0.5 μm to about 3 μm. In each of the first and second electrodes EL1 and EL2, a thickness of the second part may be smaller than a thickness of the first part. A portion of the second part of each of the first and second electrodes EL1 and EL2 may contact the upper surface of the substrate S. However, this is merely an example, and each of the first and second electrodes EL1 and EL2 may have various shapes that contact the channel layer CL and define the gap region G. The first and second electrodes EL1 and EL2 may include a conductive material such as metal or the like. For example, the first and second electrodes EL1 and EL2 may include gold (Au) or chromium (Cr).

A first input signal IS1 and a second input signal IS2 may be input to each of the unit cells UC. The first input signal IS1 may be an electric pulse signal input through one of the first electrode EL1 and the second electrode EL2. The second input signal IS2 may be an optical pulse signal input through a portion of the channel layer CL exposed by the gap region G between the first electrode EL1 and the second electrode EL2. The second input signal IS2, for example, may have a wavelength selected from a wavelength band of about 400 nm to about 850 nm.

Figure 2B:
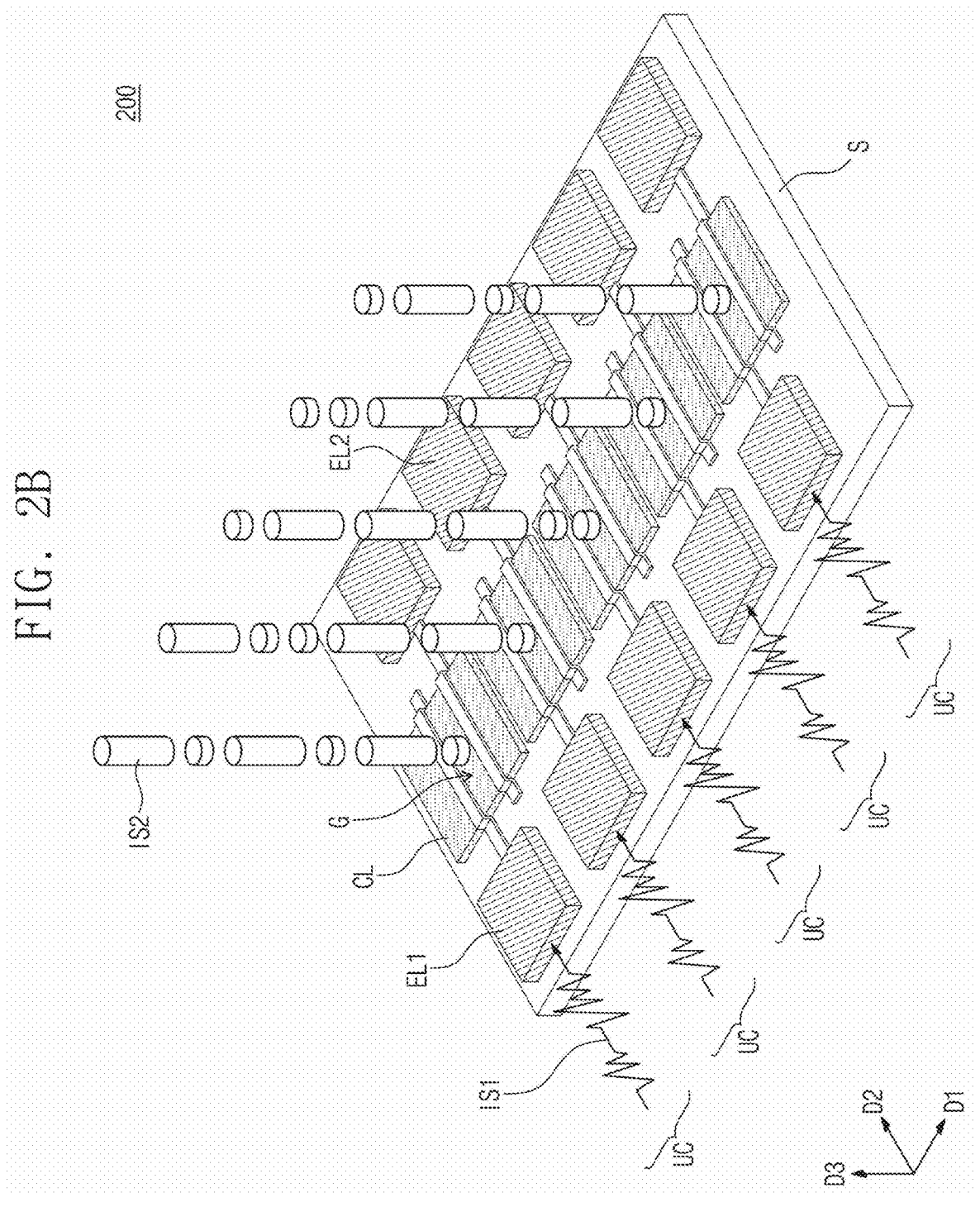

FIG. 2B is a perspective view for describing a synaptic device according to embodiments of the inventive concept. Hereinafter, for convenience, descriptions that are substantially the same as those provided above with reference to FIG. 2A will not be provided, and differences therebetween will be described in detail.

Referring to FIG. 2B, the channel layer CL on the substrate S may be provided in plurality. Each of the channel layers CL may intersect the first electrode EL1 and the second electrode EL2. The channel layers CL may be spaced apart from each other in the first direction DE A portion of the substrate S may be exposed between the channel layer CL.

Figures 3A, 3B:
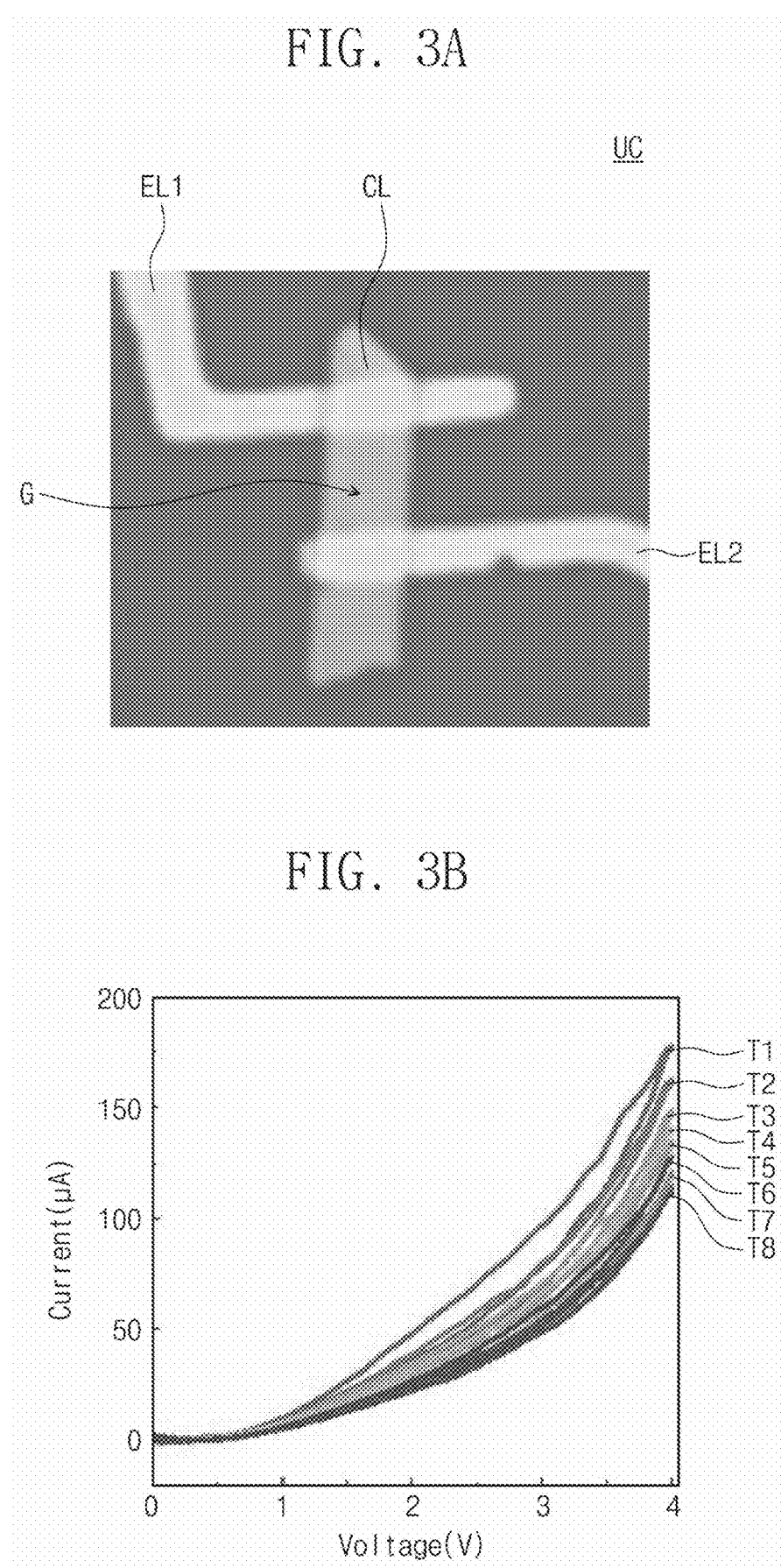
FIG. 3A is a conceptual diagram for describing a unit cell of a synaptic device according to embodiments of the inventive concept.
FIGS. 3B, 3C, 3D, and 3E are graphs for describing characteristics of a synaptic device according to embodiments of the inventive concept.

FIG. 3A is a conceptual diagram for describing a unit cell of a synaptic device according to embodiments of the inventive concept. FIGS. 3B, 3C, 3D, and 3E are graphs for describing characteristics of a synaptic device according to embodiments of the inventive concept.

Referring to FIG. 3A, the unit cell UC of a synaptic device according to an embodiment of the inventive concept may include the channel layer CL and the first and second electrodes EL1 and EL2 connected thereto. Each of the first and second electrodes EL1 and EL2 may cover a portion of the channel layer CL.

FIGS. 3A and 3B illustrate voltage-current (V-I) graphs corresponding to a result of performing, multiple times, a trial in which a voltage applied between the first electrode EL1 and the second electrode EL2 of the unit cell UC is decreased after being increased. Here, a unit of voltage is V, and a unit of current is μA. As a result of first to eighth trials T1 to T8, a current for the same voltage reduces as the number of repetitions of the trial is increased, which indicates that the channel layer CL exhibits synaptic plasticity (or memristor characteristic). Hereinafter, a current (or photocurrent) represents a current flowing through the channel layer CL, and is measured by the first electrode EL1 or the second electrode EL2.

Figures 3C, 3D:
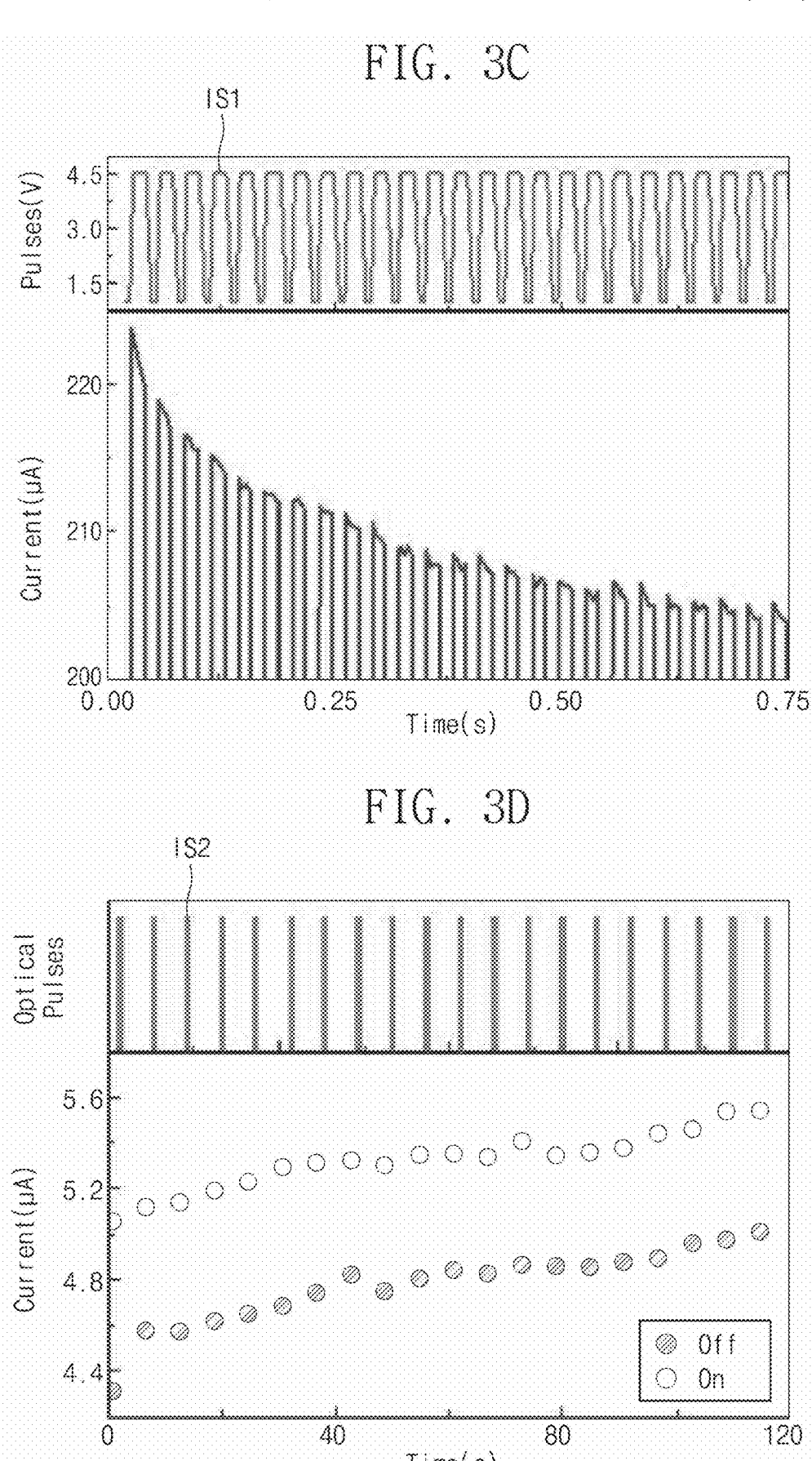

FIG. 3C illustrates a graph showing a current change over time when the first input signal IS1 is input. Here, a unit of time is second (s), a unit of voltage is V, and a unit of current is μA. The first input signal IS1, for example, is a pulse signal having a pulse voltage of about 4.5 V, a pulse width of about 20 ms, and a pulse repetition interval (PRI) of about 30 ms. As a result of inputting the first input signal IS1 for about 0.75 s, the current reduces over time, and this result matches FIG. 3B.

FIG. 3D illustrates a graph showing a current change over time when the second input signal IS2 is input. Here, a unit of time is second (s), and a unit of current is μA. The second input signal IS2, for example, is a pulse signal having a wavelength of about 725 nm, pulse power of about 43 mW, and a pulse repetition interval of about 3 s. Here, a read voltage of about 0.5 V may be applied between the first electrode EL1 and the second electrode EL2 to measure a current induced by the second input signal IS2. As a result of inputting the second input signal IS2 for about 120 s, the current increases over time, and this result is opposite to FIGS. 3B and 3C.

Referring to FIGS. 3C and 3D, a current change according to the first input signal IS1 or the second input signal IS2 may be nonlinear. Namely, the current may change nonlinearly even if pulses having the same magnitude are repeated at the same interval.

Figure 3E:
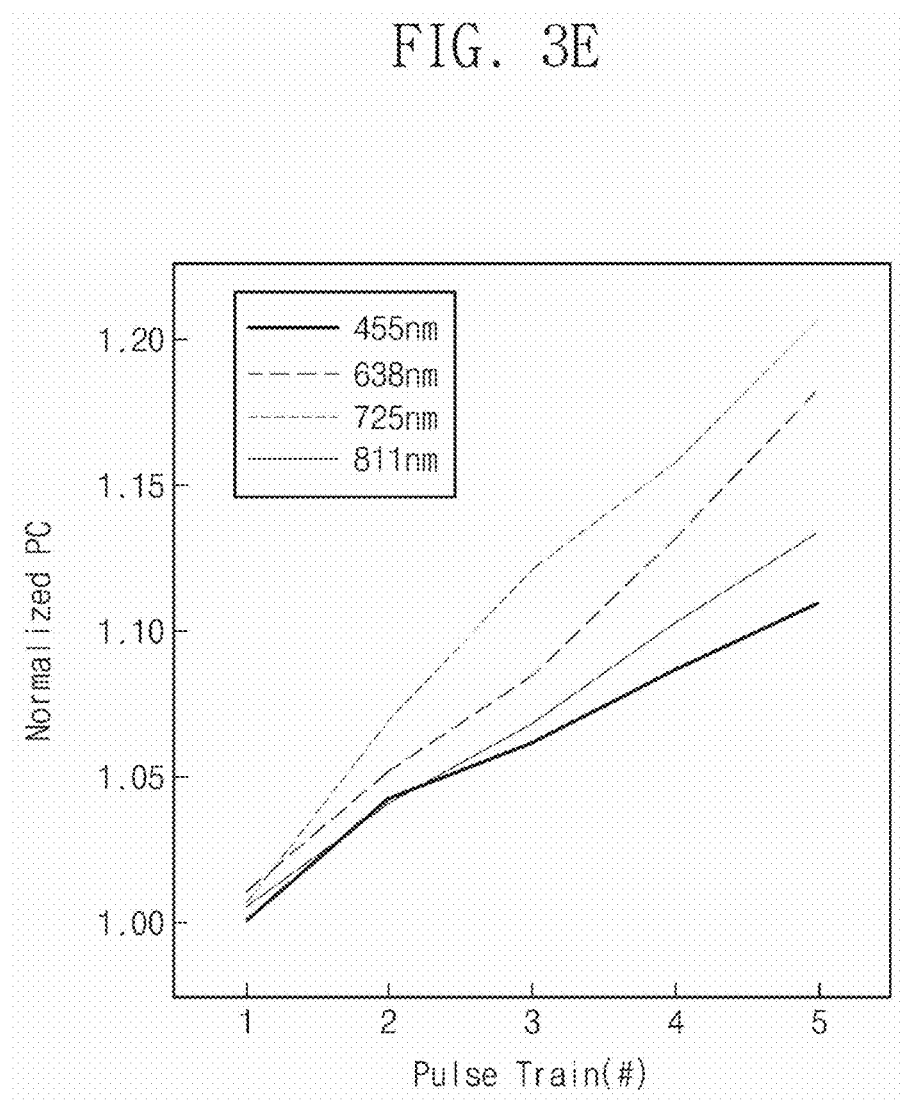

FIG. 3E illustrates a graph showing a change in normalized photocurrent when pulse trains that are similar to the second input signal IS2 described with reference to FIG. 3D but have different wavelengths are input. The synaptic device according to an embodiment of the inventive concept exhibits a result matching FIG. 3D in at least a wavelength band of about 400 nm to about 850 nm.

Figure 3F:
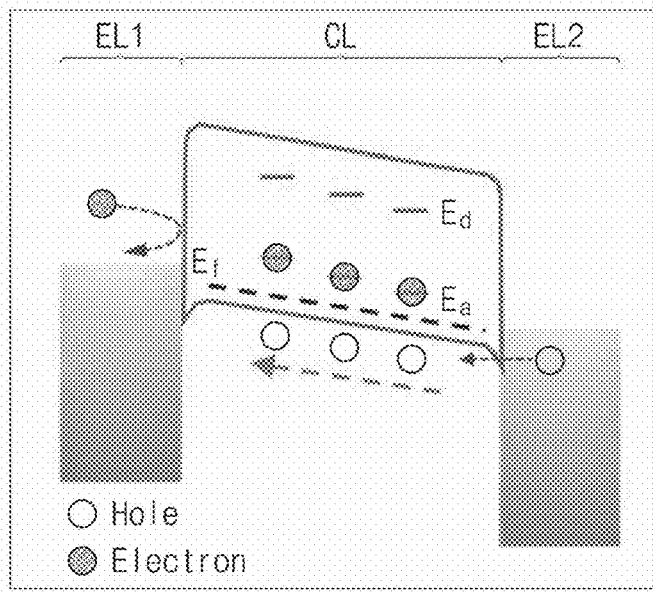
FIGS. 3F, 3G, and 3H are band diagrams for describing characteristics of a synaptic device according to embodiments of the inventive concept.
Figure 3G:
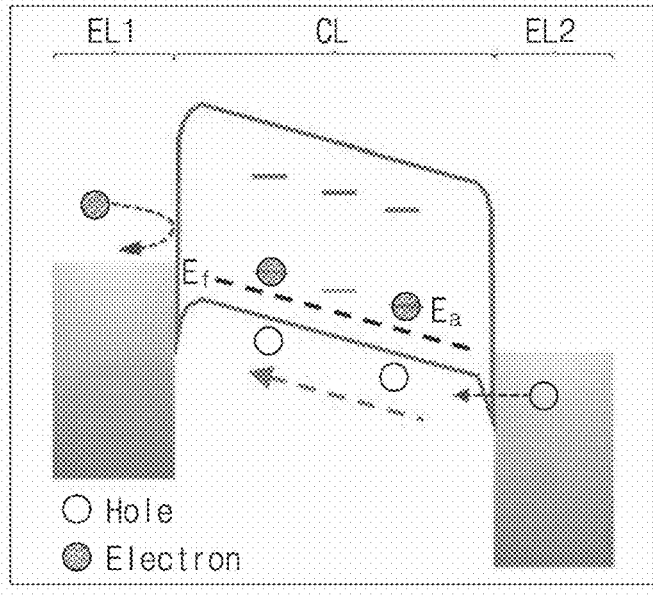
Figure 3H:
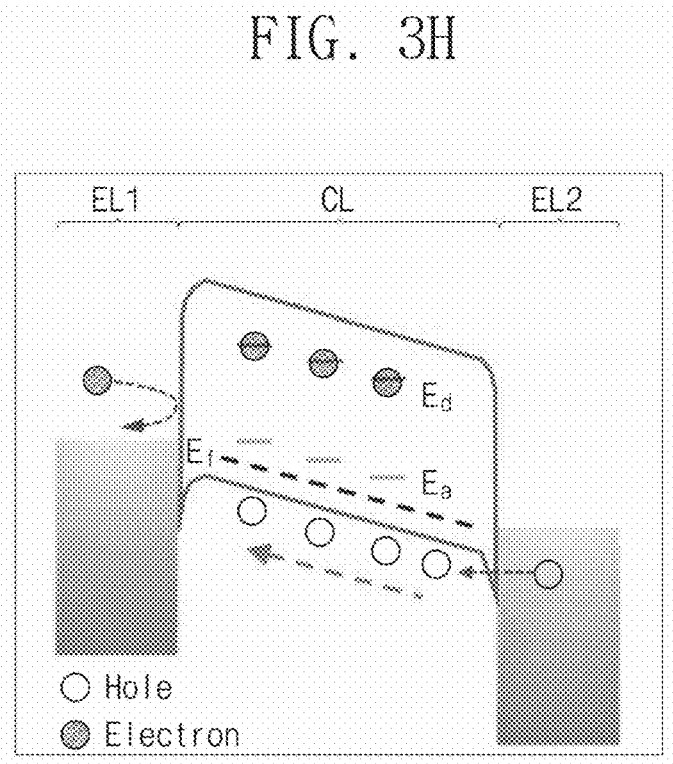

FIGS. 3F, 3G, and 3H are band diagrams for describing characteristics of a synaptic device according to embodiments of the inventive concept. A reason why FIGS. 3B and 3C and FIG. 3D show opposite tendencies will be described with reference to FIGS. 3F, 3G, and 3H. Here, the channel layer CL includes, for example, p-type SnS.

FIG. 3F illustrates a band diagram of the channel layer CL that is in an equilibrium state. Here, a bias voltage $V_d$ applied between the first electrode EL1 and the second electrode EL2 may be lower than a threshold voltage $V_{th}$, and an acceptor state $E_a$ may be filled with electrons.

FIG. 3G illustrates a band diagram of the channel layer CL when the bias voltage $V_d$ applied between the first electrode EL1 and the second electrode EL2 is higher than the threshold voltage $V_{th}$ (i.e., when an electric pulse signal such as the first input signal IS1 is applied). Here, portion of the electrons trapped in the acceptor state $E_a$ may recombine with holes, and thus a current in the channel layer CL may reduce.

FIG. 3H illustrates a band diagram of the channel layer CL when the bias voltage $V_d$ applied between the first electrode EL1 and the second electrode EL2 is lower than the threshold voltage $V_{th}$, but an optical pulse signal such as the second input signal IS2 is input. Here, the electrons of the acceptor state $E_a$ may be excited and trapped in a donor state $E_d$, and holes may be further generated from a valence band, and thus conductivity of the channel layer CL may increase. This phenomenon is referred to as a photo-gating effect.

Figures 4A, 4B:
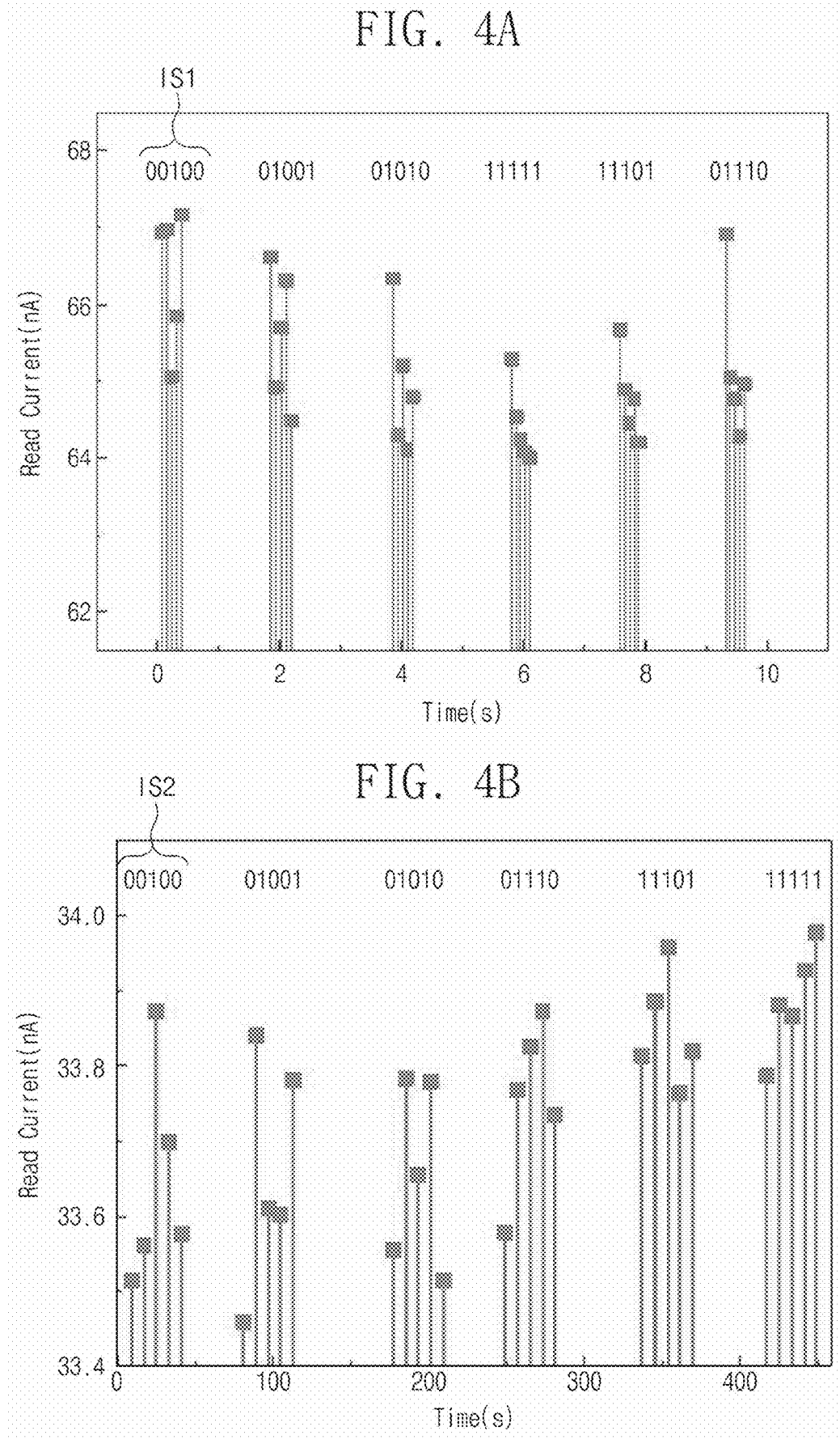
FIGS. 4A and 4B are graphs for describing a result of inputting various input signals to a synaptic device according to embodiments of the inventive concept.

FIGS. 4A and 4B are graphs for describing a result of inputting various input signals to a synaptic device according to embodiments of the inventive concept.

Referring to FIGS. 2A and 4A, a graph is described, which shows a read current change over time when the first input signals IS1 are input to the unit cell UC of the synaptic device according to an embodiment of the inventive concept. Here, a unit of time is second (s), and a unit of current is nA.

Each of the first input signals IS1 may include five signals input sequentially. Here, each of the five signals represents '1' or '0'. A signal representing '1', for example, is an electric pulse having a pulse voltage of about 4 V and a pulse width of about 50 ms. A period of the five signals is about 100 ms or less.

Referring to FIG. 4A, the first input signals IS1 may be binary pulse signals such as (00100), (01001), (01010), (11111), (11101), and (01110). The current reduces when a signal representing '1' appears in the first input signals IS1. This is because portion of the electrons trapped in the acceptor state $E_a$ recombine with holes and are detrapped, as described above with reference to FIG. 3G. The current starts to increase when a signal representing '0' appears in the first input signals IS1. This is because the electrons are trapped again in the acceptor state $E_a$ as described above with reference to FIG. 3F.

As described above with reference to FIG. 3C, since a current change according to each of the first input signals IS1 is nonlinear, final current amplitudes achieved after finishing inputting each of the first input signals IS1 may be different from each other.

Referring to FIGS. 2A and 4B, a graph is described, which shows a read current change over time when the second input signals IS2 are input to the unit cell UC of the synaptic device according to an embodiment of the inventive concept. Here, a unit of time is second (s), and a unit of current is nA.

Each of the second input signals IS1 may include five signals input sequentially. Here, each of the five signals represents '1' or '0'. A signal representing '1', for example, is an optical pulse having a wavelength of about 725 nm, pulse power of about 42 mW, and a pulse width of about 5 s. A period of the five signals is about 3 s.

Referring to FIG. 4B, the second input signals IS2 may be binary pulse signals such as (00100), (01001), (01010), (01110), (11101), and (11111). The current increases when a signal representing '1' appears in the second input signals IS2. This is caused by a photo-gating effect in which the electrons of the acceptor state $E_a$ are excited and trapped in the donor state $E_d$, and holes are further generated from a valence band, as described above with reference to FIG. 3H. The current starts to decrease when a signal representing '0' appears in the second input signals IS2. This is because the electrons are trapped again in the acceptor state $E_a$ as described above with reference to FIG. 3F.

As described above with reference to FIG. 3D, since a current change according to each of the second input signals IS2 is nonlinear, final current amplitudes achieved after finishing inputting each of the second input signals IS2 may be different from each other.

Figure 5:
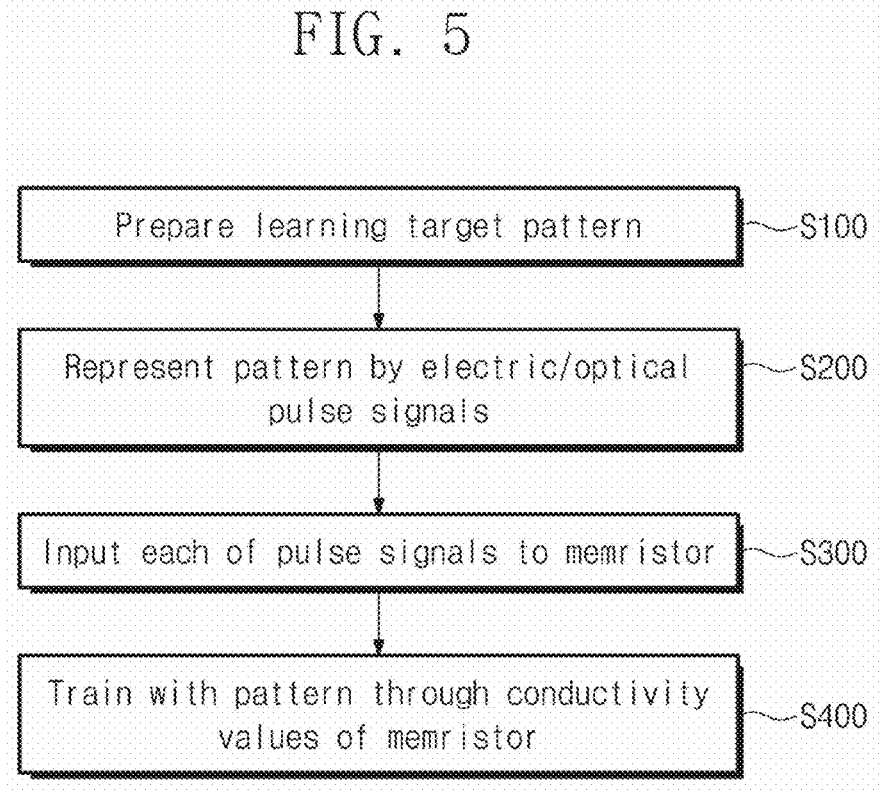
FIG. 5 is a flowchart for describing a reservoir computing method according to embodiments of the inventive concept.

FIG. 5 is a flowchart for describing a reservoir computing method according to embodiments of the inventive concept.

Referring to FIG. 5, a reservoir computing method according to an embodiment of the inventive concept may include preparing learning target patterns (S100), representing each of the learning target patterns by electric pulse signals and/or optical pulse signals (S200), inputting each of the pulse signals to a memristor (S300), and training with each of the learning target patterns through conductivity values (or current values) of the memristor (S400). The reservoir computing method according to an embodiment of the inventive concept will be described in more detail with reference to FIGS. 6A and 6B.

Here, reservoir computing (RC) is one of learning algorithms for learning data that changes over time, and uses a scheme of projecting (i.e., mapping) information of an input signal according to time to a high-dimensional space by using a reservoir having a short-term memory characteristic and nonlinear function characteristic. In the reservoir computing, since only an input/output function is required to be learned, a network to be trained may be minimized, and thus a signal that changes over time may be learned and analyzed with relatively low energy and low cost.

Figure 6A:
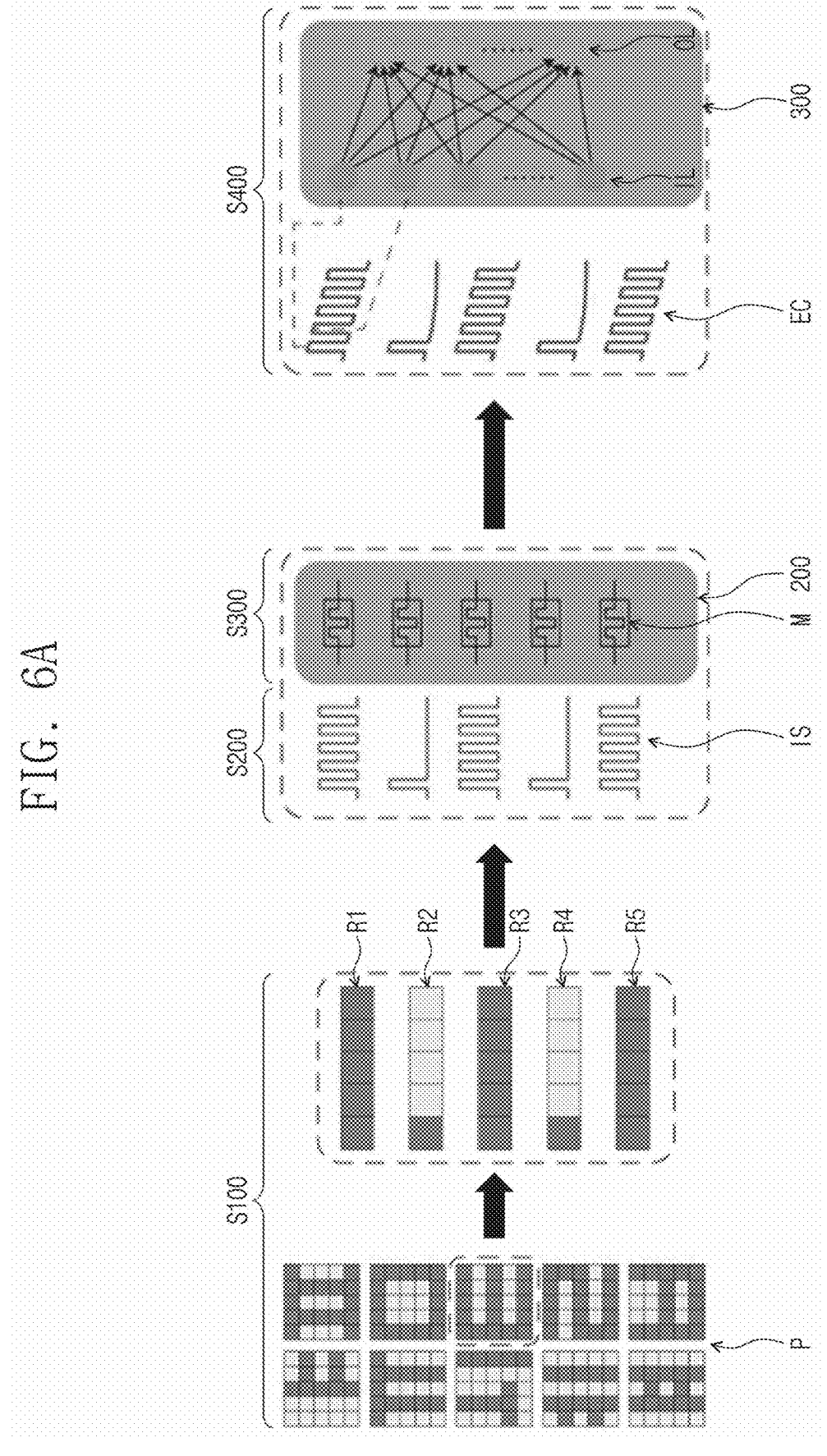
FIG. 6A is a conceptual diagram for describing a reservoir computing method according to embodiments of the inventive concept.
Figure 6B:
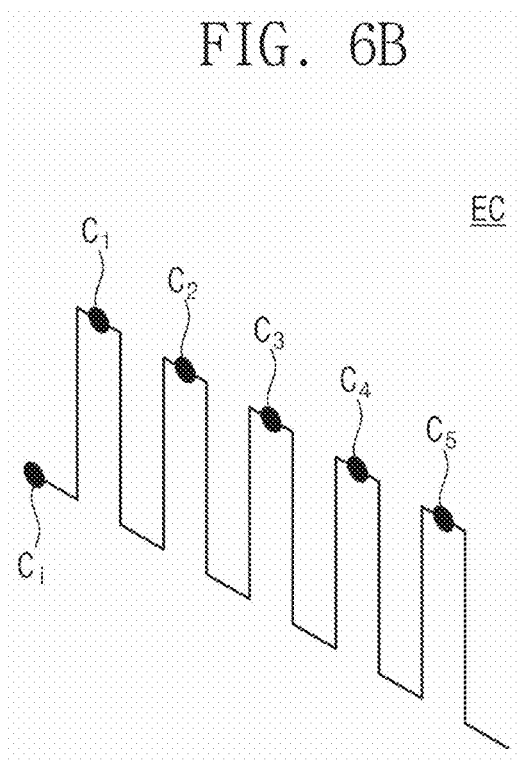
FIG. 6B is a conceptual diagram for describing extraction of conductivity values of a synaptic device in a reservoir computing method according to embodiments of the inventive concept.

FIG. 6A is a conceptual diagram for describing a reservoir computing method according to embodiments of the inventive concept. FIG. 6B is a conceptual diagram for describing extraction of conductivity values of a synaptic device in a reservoir computing method according to embodiments of the inventive concept.

Referring to FIGS. 5A and 6A, learning target patterns P may be prepared (S100). The learning target patterns P may be, for example, Korean consonants and vowels. However, this is merely an example, and the learning target patterns P may be syllables, words, or sentences of Korean language, alphabets, words, or sentences of other languages, or nonverbal symbols, pictures, or figures. A learning process for Korean consonant "ㅌ" among the plurality of learning target patterns P will be described as an example with reference to FIG. 6A.

Thereafter, each of the learning target patterns P may be expressed by electric pulse signals and/or optical pulse signals (S200). Representing each of the learning target patterns P by electric pulse signals and/or optical pulse signals (S200) may include representing each of the learning target patterns P by a plurality of rows (or columns) and representing each of the plurality of rows by an electric pulse signal and/or optical pulse signal. According to embodiments, each of the learning target patterns P may be expressed by a single matrix.

"ㅌ"-shaped pattern, for example, may be expressed by first to fifth rows R1 to R5. The first to fifth rows R1 to R5 may be expressed by a plurality (e.g., five) of input signals IS. Each of the input signals IS may be a binary pulse signal. Each of the input signals IS may be an electric signal or optical signal. The first to fifth rows R1 to R5 of the "ㅌ"-shaped pattern, for example, may be expressed by input signals IS such as (11111), (10000), (11111), (10000), and (11111).

Thereafter, each of the input signals IS may be input to a memristor M of the measurement unit 200. The memristor M may correspond to a reservoir having a short-term memory characteristic and nonlinear function characteristic. The memristor M may correspond to the unit cell UC of the measurement unit 200 described with reference to FIGS. 1 and 2A.

Thereafter, training may be performed with each of the learning target patterns P through conductivity values of the memristor M (S400). Training with each of the learning target patterns P through conductivity values of the memristor M (S400) may include extracting the conductivity values from a conductivity graph EC of the memristor M and inputting the conductivity values to a machine learning model. For example, each of the input signals IS of the "ㅌ"-shaped pattern may change electric conductivity of the memristor M, and a plurality of conductivity values may be extracted from the conductivity graph EC of the memristor relative to time.

Referring to FIGS. 6A and 6B, the conductivity graph EC is described, which is changed according to the signal (11111) (i.e., signal corresponding to any one of the first row R1, the third row R3, and the fifth row R5 of the "ㅌ"-shaped pattern) among the input signals IS. A plurality of conductivity values may be extracted from the conductivity graph EC. The plurality of conductivity values may include an initial conductivity value $C_i$ and first to fifth pulse conductivity values $C_1$ to $C_5$ which change according to the signal (11111). The first pulse conductivity value $C_1$ may be greater than the initial conductivity value $C_i$. Conductivity values may decrease from the first pulse conductivity value $C_1$ to the fifth conductivity value $C_5$.

The machine learning model may correspond to the learning unit 300 described with reference to FIG. 1. The learning unit 300 may include a plurality of layers. Each of the plurality of layers may include a plurality of nodes, wherein the nodes may have a weight and may be connected to each other. For example, the learning unit 300 may include an input layer IL and an output layer OL. The learning unit 300 may further include at least one additional layer between the input layer IL and the output layer OL. The initial conductivity value $C_i$ and the first to fifth pulse conductivity values $C_1$ to $C_5$ may be input to the input layer IL of the learning unit 300.

Figure 7A:
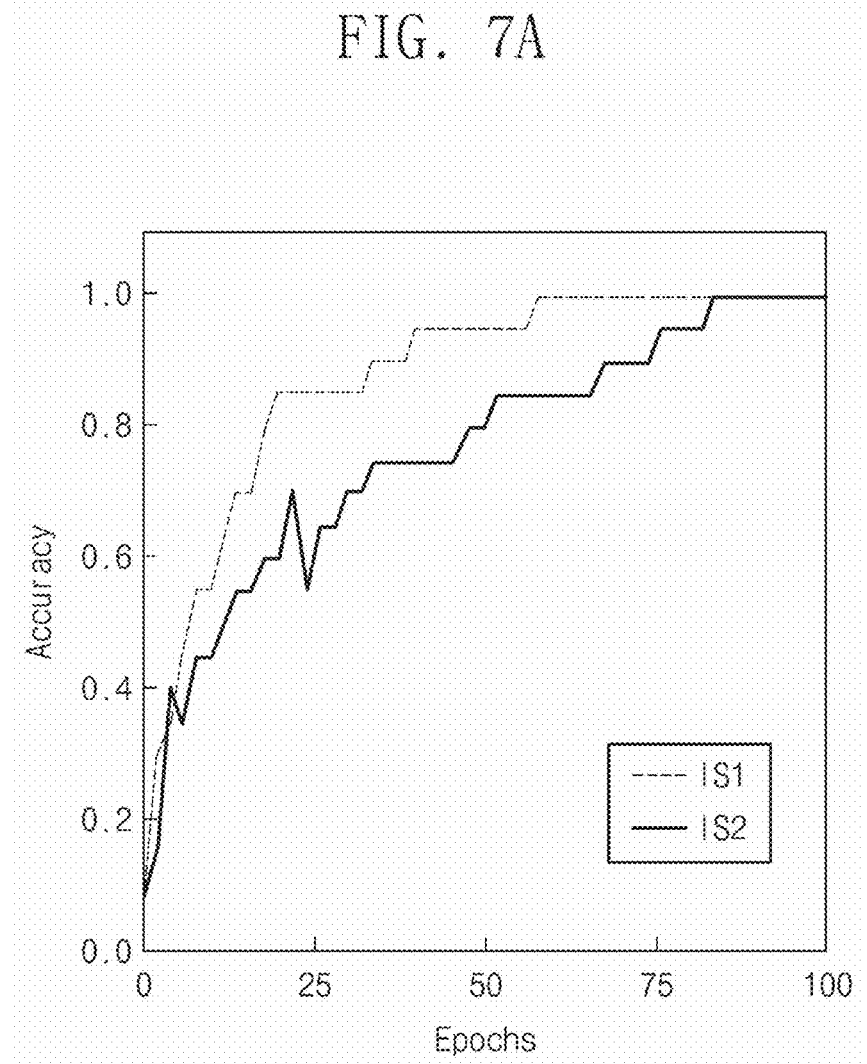
FIGS. 7A and 7B are graphs for describing a result of a reservoir computing method according to embodiments of the inventive concept.
Figure 7B:
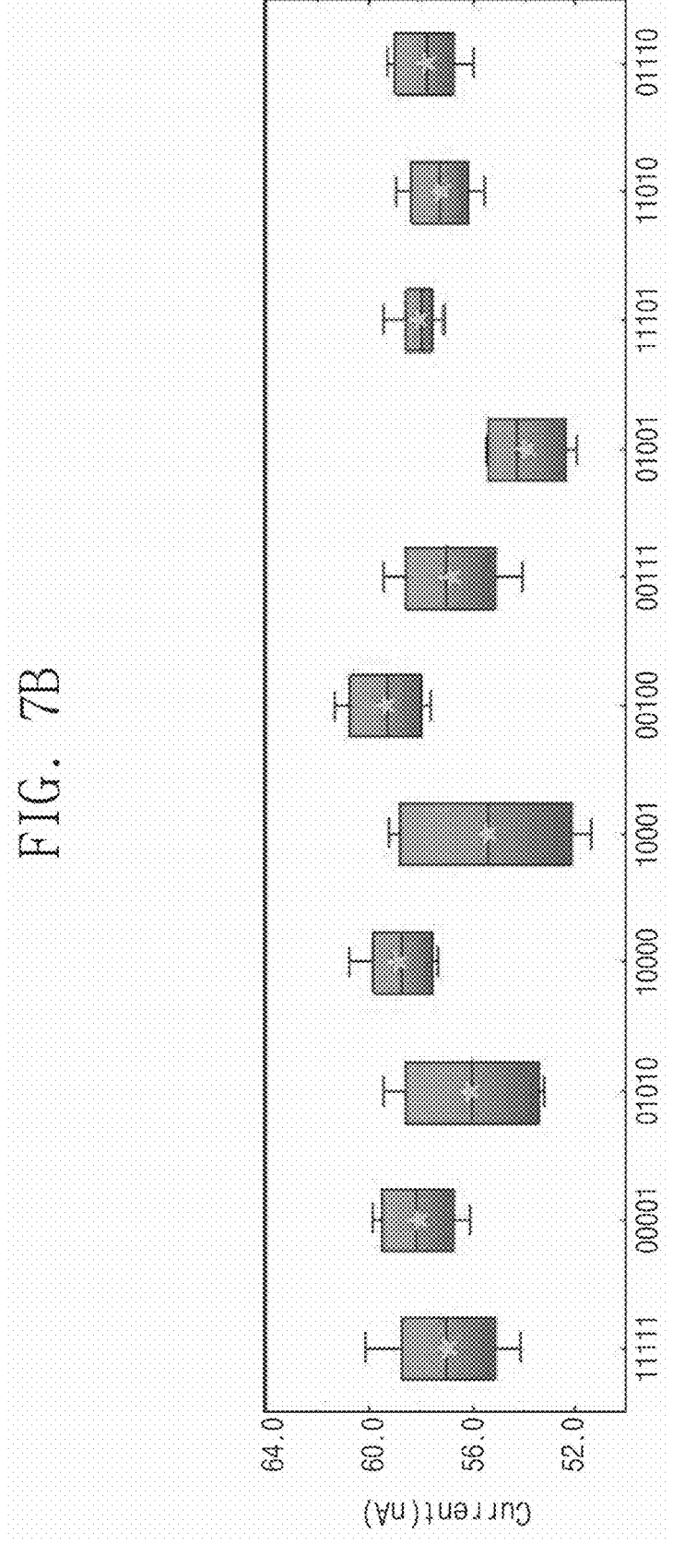

FIGS. 7A and 7B are graphs for describing a result of a reservoir computing method according to embodiments of the inventive concept.

Referring to FIGS. 6A and 7A, a graph is described, which shows accuracy according to an epoch number when the first input signal IS1 that is an electric pulse signal is used as a signal indicating the learning target patterns P and when the second input signal IS2 that is an optical pulse signal is used. Here, the epoch number represents the number of repetitions of machine learning performed in the machine learning unit 300, and the accuracy represents classification accuracy for the learning target patterns P. When the first input signal IS1 is used, the accuracy of at least about 0.9 (i.e., 90%) may be obtained when the epoch number is at least about 50. When the second input signal IS2 is used, the accuracy of at least about 0.9 (i.e., 90%) may be obtained when the epoch number is at least about 75.

Referring to FIGS. 6A and 7B, a graph is described, which shows current measured as a result of inputting different binary pulse signals. Here, a unit of current is nA. Currents measured as a result of inputting different binary pulse signals to the memristor M are different from each other, and this result is caused by the short-term memory characteristic and nonlinear function characteristic of the memristor M. Therefore, the learning unit 300 may learn and analyze a signal that changes over time, such as the learning target patterns P, with relatively low energy and low cost.

Figure 8A:
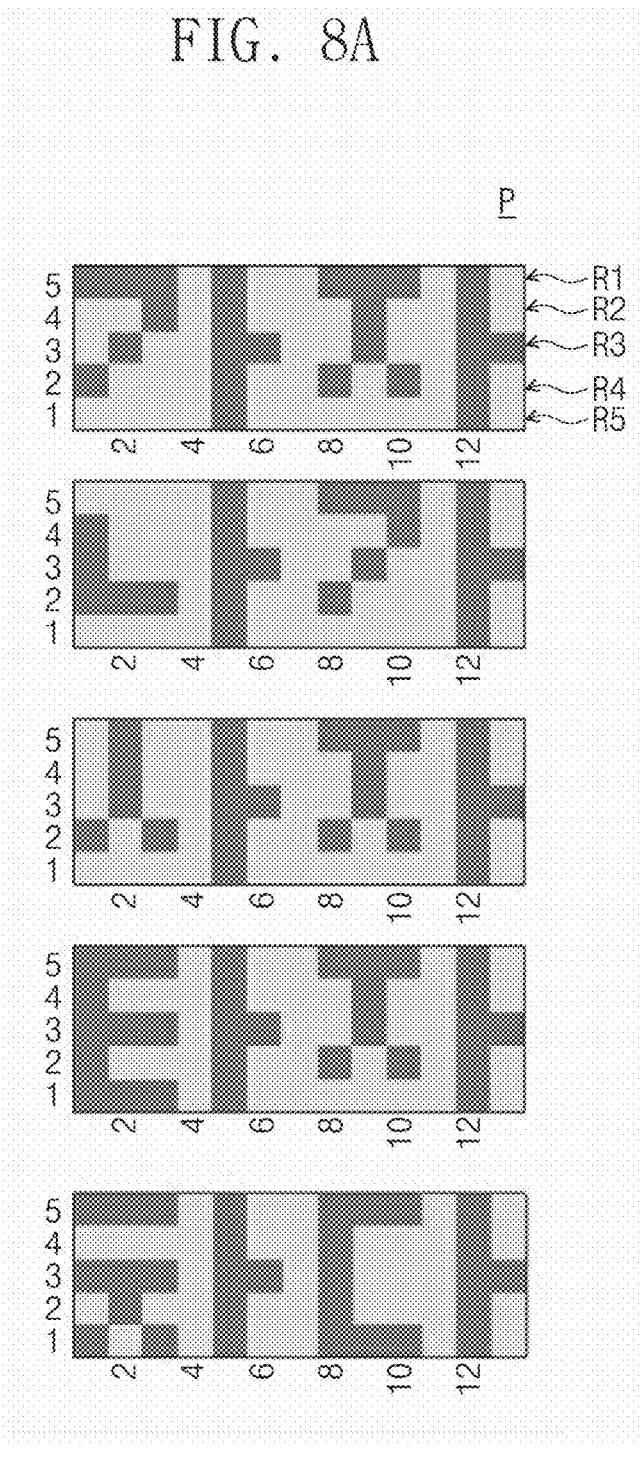
FIG. 8A is a conceptual diagram for describing examples of a learning target pattern used in a reservoir computing method according to embodiments of the inventive concept.
Figures 8B, 8C:
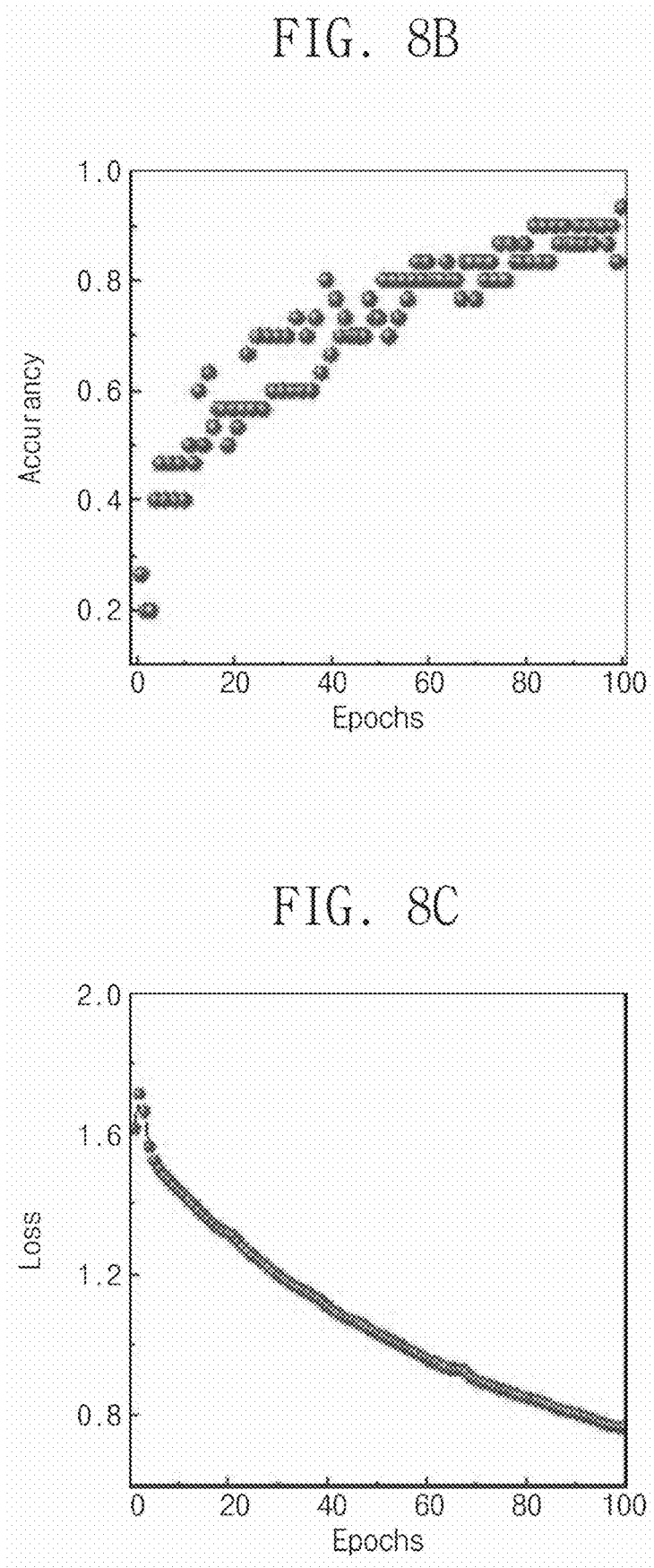
FIGS. 8B and 8C are graphs for describing a result of a reservoir computing method using the learning target patterns shown in FIG. 8A.

FIG. 8A is a conceptual diagram for describing examples of a learning target pattern used in a reservoir computing method according to embodiments of the inventive concept. FIGS. 8B and 8C are graphs for describing a result of a reservoir computing method using the learning target patterns shown in FIG. 8A.

Referring to FIG. 8A, the learning target patterns P may be 2-syllable Korean words such as "가자" (Let's go), "나가" (Get out), "사자" (Let's buy), "타자" (Let's ride), and "차다" (Kick). Each of the learning target patterns, for example, may be expressed by first to fifth rows R1 to R5. The first to fifth rows R1 to R5 may be expressed by a plurality (e.g., five) of input signals IS. Each of the input signals IS may be a binary pulse signal.

FIG. 8B illustrates a graph showing the accuracy according to the epoch number when learning the learning target patterns P of FIG. 8A by using a reservoir computing method according to an embodiment of the inventive concept. Here, an electric pulse signal is used as a signal indicating the learning target patterns P, and the accuracy of at least about 0.9 (i.e., 90%) may be obtained when the epoch number is at least about 80.

FIG. 8C illustrates a graph showing a loss according to the epoch number. Here, the loss represents a cross entropy loss of machine learning, and decreases as the epoch number increases.

According to a reservoir computing method according to an embodiment of the inventive concept, since only an input/output function is required to be learned, a network to be trained may be minimized, and thus a signal that changes over time may be learned and analyzed with relatively low energy and low cost.

Although the embodiments of the present invention have been described, it is understood that the present invention should not be limited to these embodiments but various changes and modifications can be made by one ordinary skilled in the art within the spirit and scope of the present invention as hereinafter claimed.

11

What is claimed is:

1. A reservoir computing device comprising:

an input signal generation unit configured to generate an input signal corresponding to a learning target pattern;

a measurement unit configured to measure a result according to the input signal; and a learning unit configured to learn the learning target pattern through values measured by the measurement unit, wherein the measurement unit comprises:

a substrate; and a plurality of unit cells on the substrate, wherein the unit cells each comprise a channel layer and a first electrode and second electrode intersecting the channel layer, wherein the first electrode and the second electrode are spaced apart from each other, and define a gap region exposing a portion of the channel layer, and the channel layer comprises a 2-dimensional semiconductor material or a 2-dimensional ferroelectric material.

2. The reservoir computing device of claim 1, wherein the learning target pattern is a consonant, vowel, syllable, word, sentence, nonverbal symbol, picture, or figure.

3. The reservoir computing device of claim 1, wherein the input signal is a signal that changes over time.

4. The reservoir computing device of claim 3, wherein the input signal includes at least one of an electric pulse signal or an optical pulse signal.

5. The reservoir computing device of claim 1, wherein the result according to the input signal, measured by the measurement unit, is an electric conductivity value of the channel layer, which changes according to the input signal.

6. The reservoir computing device of claim 1, wherein the learning target pattern is expressed by a plurality of rows, and each of the plurality of rows is expressed by a plurality of input signals.

7. The reservoir computing device of claim 1, wherein the learning unit uses single-layer perceptron, multi-layer perceptron, random forest, support vector machine, or logistic regression.

8. A reservoir computing method comprising:

preparing a learning target pattern;

representing the learning target pattern by pulse signals;

inputting each of the pulse signals to a memristor; and training with the learning target pattern through conductivity values of the memristor, wherein the memristor comprises a channel layer and a first electrode and second electrode intersecting the channel layer, wherein the first electrode and the second electrode are spaced apart from each other, and define a gap region exposing a portion of the channel layer, and the channel layer comprises a 2-dimensional semiconductor material or a 2-dimensional ferroelectric material.

9. The reservoir computing method of claim 8, wherein each of the pulse signals is a binary pulse signal.

10. The reservoir computing method of claim 8, wherein the representing the learning target pattern by the pulse signals comprises:

representing the learning target pattern by a plurality of rows; and representing each of the plurality of rows by the pulse signals.

11. The reservoir computing method of claim 8, wherein the training with the learning target pattern through the conductivity values of the memristor comprises:

extracting the conductivity values from a conductivity graph of the memristor; and inputting the conductivity values to a machine learning model.

12. The reservoir computing method of claim 8, wherein the pulse signals include at least one of an electric pulse signal or an optical pulse signal, wherein the electric pulse signal is input through the first electrode or the second electrode, and the optical pulse signal is input through the gap region.

* * * * *